United States Patent [19]

Yao

[11] 4,107,554

[45] Aug. 15, 1978

[54] DATA BUS ARRANGEMENT FOR JOSEPHSON TUNNELING DEVICE LOGIC INTERCONNECTIONS

[75] Inventor: Ying Luh Yao, Mahopac, N.Y.

[73] Assignee: International Business Machines Corporation, Armonk, N.Y.

[21] Appl. No.: 701,399

[22] Filed: Jun. 30, 1976

[51] Int. Cl.² .................. H03K 3/38; H03K 19/195
[52] U.S. Cl. ............................ 307/306; 307/212; 307/277
[58] Field of Search ............... 307/241, 242, 245, 277, 307/212, 306; 357/5, 83; 328/103, 152

[56] References Cited

U.S. PATENT DOCUMENTS

| 3,582,682 | 6/1971 | Carroll | 307/241 X |
| 3,953,749 | 4/1976 | Baechtold et al. | 307/212 X |

Primary Examiner—John Zazworsky
Attorney, Agent, or Firm—Thomas J. Kilgannon, Jr.

[57] ABSTRACT

A data bus is a common interconnection which serves as a two-way data link between inputs and outputs of several logic blocks in a time shared manner. A data bus arrangement is disclosed which can be utilized to interconnect a plurality of ports with each other and which utilize Josephson junction devices. Each of a plurality of ports represents the output from a computer or other logic circuit and these outputs represent inputs on control lines associated with each Josephson device which switch it. Each Josephson device is separately energized from its own current source and, upon switching, diverts current down a transmission line which has an impedance, $Z_o$. In a single wire-over ground plane embodiment, all of the transmission lines are connected to a single node in a star arrangement. A terminating resistor which terminates each of the lines in a value of resistance equal to $Z_o$ is disposed in series in the transmission line and is intended to absorb signals coming from any port so there is no reflection of incoming signals back along the transmission line. From the node at which all the transmission lines are connected, a signal generated at one port, for example, passes in parallel to each of the other ports. There, depending on whether or not a sensing Josephson junction which is associated with each transmission line is enabled, the signal is sensed at a selected sensing junction. The present approach utilizes the fact that, when an input junction is in the unactuated state, it represents a short circuit presenting no internal impedance to the incoming current which can then be absorbed in a resistance which, in spite of the presence of the switchable device, remains as a termination equal in resistance to the characteristic impedance of the transmission line. A double wire over ground plane or a wire above and below ground plane embodiment is also shown, wherein the two wires or transmission lines associated with each input port are connected to a pair of nodes. Each line has the same characteristic impedance and each is terminated by a resistance equal to the characteristic impedance. In this arrangement, the resulting signal strength available for sensing can be two times the strength of the single wire embodiment, due to a reversal of the transmission line in the neighborhood of a sense gate.

22 Claims, 2 Drawing Figures

DATA BUS ARRANGEMENT FOR JOSEPHSON TUNNELING DEVICE LOGIC INTERCONNECTIONS

BACKGROUND OF THE INVENTION

1. Field of the Invention

This invention relates generally to data bus arrangements and is more specifically related to data bus arrangements for use with Josephson junction devices. Still more specifically it relates to a star data bus interconnection arrangement whereby a plurality of ports are placed into two-way communication with each other without the generation of spurious, reflected signals. Each of the Josephson devices which is controlled by outputs from a computer or other logic circuit arrangement on an associated control line is supplied from its own constant current source. Each device is effectively placed in parallel with every other device by transmission lines of the same characteristic impedance connected at a node or nodes. The transmission lines which are terminated by a resistance equal to the characteristic impedance of the transmission line absorb incoming signals and prevent the reflection of such signals back to the node or nodes. The number of ports and transmission lines connected to a node is limited only by such practical considerations as the ability of a sensing junction to respond to the magnitude of the current pulse supplied to each transmission line after splitting at the node or nodes. In common with other terminated line Josephson circuits, switching speed in the order of tens of picoseconds are obtainable.

2. Description of the Prior Art

In known schemes, the outputs of logic circuits are connected to a separate sensing device which is responsive to the presence of current in the output circuit. All of the sensing devices are connected in series with each other, and to the extent there are outputs present, the associated sensing devices switch and a diminution of current is detected or, for a given time frame, the voltage drops may be summed to indicate that certain outputs are present. By using biases which strobe the sensing devices, in the latter instance, the particular output can be identified. One prior art arrangement which shows the summing of outputs is U.S. Pat. No. 3,458,735. The arrangement shown is, however, not a true data bus inasmuch as it is not a two-way data link between inputs and outputs. This should be clear from the fact that all the Josephson devices are in series and the outputs are summed to indicate how many of the outputs in the form of control currents are present. Each of the switchable devices is isolated and the signal due to switching of a given device is not coupled via transmission lines to any other device. The only possible coupling is via disturb signals which may cause spurious switching of adjacent devices.

To the extent that the definition of a data bus (a common interconnection which serves as a two-way data link between inputs and outputs of several logic blocks in a time shared manner) is fulfilled by the prior art, it is known to literally use a bus which is connected to a plurality of input and output devices which are all connected to the same bus. Such arrangements are common where the information being transmitted is in the form of variations in the voltage level applied to the bus. Thus, bipolar transistor circuits and field effect transistor circuits normally provide outputs in the form of voltages which can be applied to a bus with the assurance that all lines connected to the bus will see the same voltage. Under such circumstances, impedance matching, line lengths and proper terminations do not present severe design problems. In any event, this known data bus arrangement cannot be straightforwardly substituted in circuits where the information being transmitted is in the form of current variation. Impedance matching, signal reflection and proper termination become significant design problems because of the reality of current division which is a function of the number of stations or ports which must see the same current in parallel.

An arrangement which has data bus applications is shown in a co-pending application entitled "A Distributed Josephson Junction Logic Circuit", Ser. No. 636,868, filed Dec. 2, 1975, and assigned to the same assignee as the present invention. In that application, a number of Josephson devices are placed in series with a voltage source and a portion of the transmission line is utilized to actuate other devices. The transmission line is terminated at both ends in its characteristic impedance and is capable of bidirectional flow of data among a plurality of serially disposed actuable devices and control line portions.

An IBM Technical Disclosure Bulletin entitled "Josephson Junction Circuit" by G. J. Lasher, Vol. 11, No. 10, March 1969, p.1222, shows a Josephson junction in the transmission line environment which is terminated with the characteristic impedance of the strip line so that no reflected signal returns to the junction due to its own a.c. emission. This publication is concerned with improving the bistable behavior of a Josephson junction and is not concerned with a Josephson device which is connected in parallel with a number of other devices for communicating data therebetween.

IBM Technical Disclosure Bulletin, Vol.15, No.3, August 1972, p.899, in an article entitled "Josephson Junction Circuits Having Magnetic Feedback" by H. H. Zappe, shows in FIG. 5 a shift register arrangement which includes a pair of Josephson junctions connected in parallel, each of which is connected to the same power source and terminated at one end thereof in a resistance equal to $Z_o$. A similar circuit is interleaved with the first pair of devices and each pair of Josephson devices is pulsed by alternate d.c. pulses applied to each pair. Each junction line acts as a control for the next junction. In this reference, there is no hint or suggestion that such an arrangement can be used as a data bus. Indeed, the use of the same source for pairs of devices indicates that pairs of devices are intended to be energized at the same time. This approach clearly obviates any possibility for developing a data bus in accordance with the teaching of the present application. The data bus arrangement of the present application is believed to be distinguishable and unobvious over all the references cited inasmuch as it takes advantage of the unique capability of a Josephson junction when it is in the zero voltage state to act, in combination with a series terminating resistance which matches the impedance of an associated transmission line, as a direct short to ground. In other words, the actuable device, when unactuated, has no internal impedance and, as a result, it is possible to utilize a transmission line connected to it, in one mode, as a driver and, in another mode, the same transmission line as a termination.

SUMMARY OF THE INVENTION

In accordance with the broadest aspect of the present invention, a data distribution network is provided which includes a plurality of actuable devices and means separately connected to each of them for powering the devices. Also included are means for interconnecting the plurality of devices to place them in parallel with each other, and means coupled to the plurality of devices for selectively separately actuating the devices to launch a pulse of electromagnetic energy along the interconnection means.

In accordance with the broader aspects of the present invention, a data distribution network is provided which further includes sensing means responsive to the presence of the pulse of electromagnetic energy disposed in electromagnetically coupled relationship with the interconnection means.

In accordance with the broader aspects of the present invention, a data distribution network is provided wherein the means for interconnecting the plurality of devices includes a plurality of transmission lines of given characteristic impedance; each of the plurality being connected at one end thereof to a respective one of the actuable devices and at the other end thereof to a common node.

In accordance with the broader aspects of the present invention, a data distribution network is provided wherein the means for interconnecting the plurality of devices includes a plurality of pairs of transmission lines each of given characteristic impedance; each of the plurality of pairs being connected at one end thereof to a respective one of the actuable devices and at the other end thereof to a pair of common nodes.

In accordance with more specific aspects of the present invention, a data distribution network is provided which further includes a termination resistor or a pair of terminating resistors each having a value of resistance equal to a given characteristic impedance, disposed in series with each of the transmission lines or pairs of transmission lines, respectively, and adjacent each of the actuable devices.

In accordance with still more specific aspects of the present invention, a data distribution network is provided wherein the actuable devices are capable of permitting the flow of Josephson current therethrough.

In accordance with still more specific aspects of the present invention, a data distribution network is provided which includes a plurality of actuable devices adapted to permit the flow of Josephson current therethrough and a constant current source connected to each of the actuable devices. It further includes a plurality of transmission lines of given characteristic impedance, each of the plurality being connected at one end thereof to a respective one of the actuable devices and at the other end thereof to a common node. In addition, it includes a separate control element electromagnetically coupled to each of the plurality of devices for selectively separately actuating the plurality of devices to launch a pulse of electromagnetic energy along each of the plurality of transmission lines.

In accordance with yet more specific aspects of the present invention, a data distribution network is provided which further includes a Josephson junction device adapted to switch in response to the presence of a pulse disposed in electromagnetically coupled relationship with each of the transmission lines. Finally, it includes a terminating resistor having a value of resistance equal to the given characteristic impedance disposed in series with each of the transmission lines and adjacent each of the actuable devices.

It is, therefore, an object of this invention to provide a data distribution network or data bus which can be utilized in conjunction with current controlled actuable devices.

Another object is to provide a data distribution network which can be utilized in conjunction with high-speed switching devices such as Josephson junctions.

Still another object is to provide a data distribution network or data bus which includes an actuable device in combination with a matching resistor to properly terminate a transmission line.

Still another object is to provide a data distribution network which is capable of serving as a two-way data link among a plurality of ports.

The foregoing and other objects, features and advantages of the present invention will become apparent from the following more particular description of the preferred embodiment of the invention as illustrated in the accompanying drawings.

DESCRIPTION OF A PREFERRED EMBODIMENT

In a typical data bus implementation in a computer, outputs are normally provided from a number of elements which include a central processing unit (CPU), a read only memory (ROM), a direct memory access (DMA) and a memory interface (MI). The CPU, which may have several input-output ports associated with it, must be able to carry out two-way communication with the other aforementioned computer elements. This is most conveniently done by a data bus to which all the computer elements are connected in parallel. As indicated hereinabove in the discussion of the prior art, the usual approach with voltage driven elements is to apply voltage variations to a single conductor which is connected to every other computer element. As also indicated in the prior art discussion, data buses which carry information in the form of voltage variations are more tolerant of line lengths, impedance matching and proper terminations. To the extent that current controlled devices cannot be connected to a single bus which is attached to all the computer elements of a computer system without encountering impedance matching and termination problems of large magnitude, an arrangement for connecting all the elements of a computer system in a way which minimizes such probelms is required. The data distribution network of FIG. 1 provides for two-way communication among a plurality of ports in a way which minimizes matching and termination problems of prior art data buses which cannot be directly substituted where current controlled devices are utilized and where data is transferred among the ports by current variations.

Figure 1:
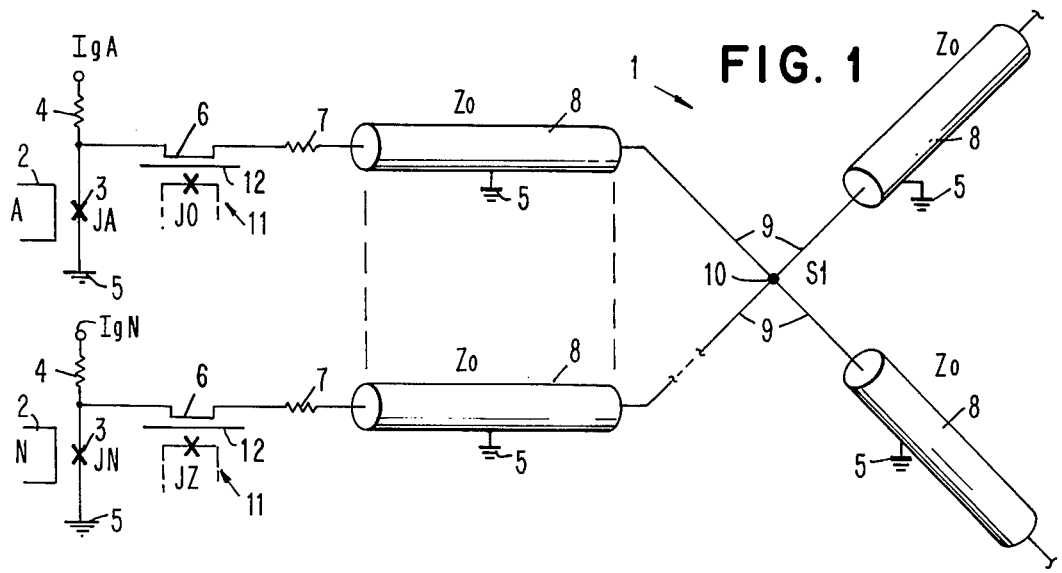
FIG. 1 is a schematic drawing of a data distribution network or data bus arrangement showing a plurality of ports connected in parallel in a wire over ground plane star configuration. Outputs from output ports control an actuable device which, upon switching, sends pulses of electromagnetic energy along a transmission line which has a given characteristic impedance. The transmission line feeds a plurality of similar transmission lines of given impedance, all of which are connected together at a node. The energy traverses each of the transmission lines which is terminated in a terminating resistance equal to the characteristic impedance of the transmission lines to prevent reflections. A sensing means is shown adjacent each actuable device which, if selected, is responsive to the presence of electromagnetic energy on the adjacent transmission line. When one actuable device is actuated, all other actuable devices associated with the network may be held in a conducting condition so that pulses of electromagnetic energy on associated transmission lines are terminated via the terminating resistor and the conducting device which connects the terminating resistor to ground.

Referring now to FIG. 1, there is shown a data distribution network or data bus 1 showing schematically a plurality of ports connected in parallel in what is intended to represent a single wire over ground plane star configuration. In FIG. 1, data distribution network 1 includes a plurality of output ports 2 otherwise identified in FIG. 1 by the letters A–N. Output ports 2 carry signals from computer elements, logic circuits or logic devices which are to be interconnected for two-way communication by means of network 1 with similar elements, circuits or devices at other ports. Output ports 2, in a preferred embodiment of the present invention, are current carrying control lines for associated Josephson devices. In FIG. 1, Josephson devices 3 otherwise identified in FIG. 1 by the reference JA–JN are disposed in electromagnetically coupled relationship with the control lines of output ports 2. Josephson devices JA–JN are fed from separate current sources IgA–IgN, respectively, via current limiting resistors 4. Josephson devices JA–JN are grounded at ground connection 5 in FIG. 1. Josephson devices 3 are shunted by short sections of conductive line which includes control line portions 6 and the latter are connected to serially disposed terminating resistors 7. At this point, terminating resistors 7 are connected to the wire of a transmission line which has a wire over ground plane configuration. In FIG. 1, the wire over ground plane configuration is schematically represented by a section of coaxial transmission line 8 having a given characteristic impedance $Z_o$. Coaxial transmission line 8 is otherwise identified in FIG. 1 by the reference $Z_o$. $Z_o$ is, of course, a function of the spacing between conductors and the ground plane, the dielectric constant of the insulating material and the width of the conductor or wire. In the usual case, the wire over ground plane transmission lines represented by coaxial transmission lines 8 in FIG. 1 consist of a conductive ground plane disposed on a substrate over which is disposed a narrow conductive line in insulated spaced relationship with the ground plane. In the usual case, for applications which utilize Josephson junctions, both the ground plane and narrow conductor are made from superconducting materials such as niobium. Thus, in FIG. 1 terminations 7 are connected directly to what would be the wire or conductor in a wire or conductor over ground plane configuration; well known to those skilled in the transmission line art. In the coaxial transmission line 8 representation in FIG. 1, terminations 7 are connected to the center conductor of coaxial transmission line 8, the outer conductor of which represents a ground plane. The outer conductor is connected to ground as indicated by the same reference character 5 as used for grounding devices 3. Emanating from each of the coaxial transmission lines 8 are conductors 9; all of which are connected to a common node 10 otherwise identified in FIG. 1 by the reference S1. While conductor 9 has been shown for purposes of exposition and clarity as extending from coaxial transmission line 8, it should be appreciated that, in reality, conductors 9 would be portions of the same conductive line or wire forming the wire over ground plane transmission lines which coaxial transmission lines 8 represent in FIG. 1. Thus, to satisfy the requirements of the arrangement of the present invention, the conductive lines or wires would all be disposed over a ground plane in insulated spaced relationship to provide the desired impedance, $Z_o$, and would merely be connected together at some common point on the insulation spacing the conductors or wires from their associated ground plane.

Control line portions 6 have associated with each of them sense gates 11 otherwise identified in FIG. 1 as JO–JZ. Sense gates 11 are similar to Josephson devices 3 and are connected in a well-known way to sense amplifiers or other circuits well known to those skilled in the Josephson junction art. In addition to control line portion 6, each sense gate 11 has associated with it a bias line 12 which is utilized, as will be seen hereinafter, to selectively bias its associated sense gate 11 to enable gate 11 to respond to a current pulse transmitted from a port different from the port with which the particular sense gate is associated. Bias line 12 may be connected to a pulsed current source which, in conjunction with the overall circuit timing, is triggered to apply an enabling bias or strobe to bias lines 12.

While only ports A and N and their associated devices, terminations and transmission lines have been described in detail in FIG. 1, it should be appreciated that the right-most coaxial transmission lines 8 in FIG. 1 have similar ports, devices and transmission lines connected to them in the same way as ports A and N and can participate in two-way communications with any other port. It should be further appreciated that any number of ports can be connected to node 10, their number being limited only as such practical considerations as the amount of current available and the ability to sense the current amplitudes transmitted to sense gates 11.

Assuming for purposes of explanation that a current pulse representative of binary data is applied to output port A and that it is intended to transmit this data to sense gate JZ which is associated with output port N, the data distribution network 1 operates in the following way. In a stand-by state, with no binary information applied at any of output ports 2, Josephson devices 3 are in a conductive or zero voltage stage as a result of the flow of gate current IgA–IgN through them. In this condition, because the current through devices 3 does not exceed a maximum value, current flows in devices 3 which include tunnel barriers with no voltage drop when devices 3 are operated at or near the temperature of liquid helium. When the maximum current through devices 3 is exceeded or, as will be done herein, the maximum current is reduced by applying a bias on an associated control line, devices 3 switch to a voltage state in a well-known way and a voltage drop, $2\Delta/e$, appears across each of the devices. In FIG. 1, output ports 2 are current carrying conductors which act as control lines for devices JA-JN.

In a transmitting mode, a current representative of a binary signal is applied to output port A. At this point, the magnetic field produced by this current intercepts Josephson device JA, reducing the value of maximum current to a value below the value of current IgA and device JA switches to the voltage state. The switching of device JA to the voltage state presents a high impedance to current IgA and diverts the current into transmission line 8 via control line portion 6 and terminating resistor 7. The current thus diverted from Josephson device JA continues to be diverted as long as the current signal is applied at output port A at which time it is rediverted back through Josephson device JA if the device is self-resetting or non-latching. If Josephson device JA is a latching device, current IgA must be reduced to a value below a minimum value in order to terminate the diversion of current into transmission line 8. In any event, a current pulse first encounters terminating resistor 7 and then encounters transmission line 8 of impedance $Z_o$ and is transmitted therethrough arriving at node S1. Because the current pulse encounters a change in impedance at node S1, a portion of the energy is reflected back toward port A and is absorbed in terminating resistor 7. At node S1, assuming only four transmission lines are connected to node S1, the current pulse emanating from port A will inject current to the three branches connected to node S1. If current of magnitude I were present (the total transmitted current at S1 which is determined by $Z_o$ and the number of ports connected to S1), current of magnitude I/3 would be present in each of the coaxial transmission line sections 8. Thus, a current pulse of magnitude I/3 appears in transmission line 8 which is associated with output port N. This current pulse, upon encountering terminating resistor 7 which has a value of resistance equal to $Z_o$ and as such presents, in combination with Josephson device JN which is in the zero voltage state, a matched terminated line which absorbs the energy of the current pulse without reflection. The current pulse, however, which travels to ground via ground connection 5, passes through control line portion 6 where it applies a control field to sense gate JZ. Because sense gate JZ has been enabled by the application of a bias current on bias line 12, only a small additional current supplied by the travelling current pulse is required to switch sense gate JZ to the voltage state. The switching of sense gate JZ to the voltage state can be detected by well-known means by sensing the change in current through sense gate JZ or by monitoring the voltage across sense gate JZ. At this point, it should be appreciated that a current pulse of the same magnitude appears at every other sense gate which, as has been indicated heretofore, is coupled to each of transmission lines 8. To receive the information transmitted at another port, all that would be required would be to bias or strobe the associated sense gate 11 by applying an appropriate current to its associated bias line 12. Information may be transmitted from port N to the sense gate 11 associated with port A or to sense gates 11 associated with any other port in the same way as information was transmitted from port A. To the extent that reflections occur from terminating resistor 7 when a pulse is launched from its associated port, it should be appreciated that these reflections do not represent an impediment to the operation of the network inasmuch as each port has its own independent current source which, within limits, can supply enough current to provide an acceptable signal level at sense gates 11. Unacceptable reflections would be those which would be reflected at sense gates 11 were they not terminated by a matched terminating resistor connected to ground at the receiving port. It should be appreciated that all Josephson devices 3 which are associated with an enabled sense gate are in the zero voltage state and, accordingly, ground terminating resistor 7 at the desired time. The dual function of Josephson junctions 3, one in a transmitting mode and a second in the receiving mode, permits the connection of all Josephson junctions 3 in parallel without having to utilize a separately controlled device which, in a receiving mode, would ground terminating resistor 7 and in the transmitting mode, would eliminate the ground on terminating resistor 7.

Figure 2:
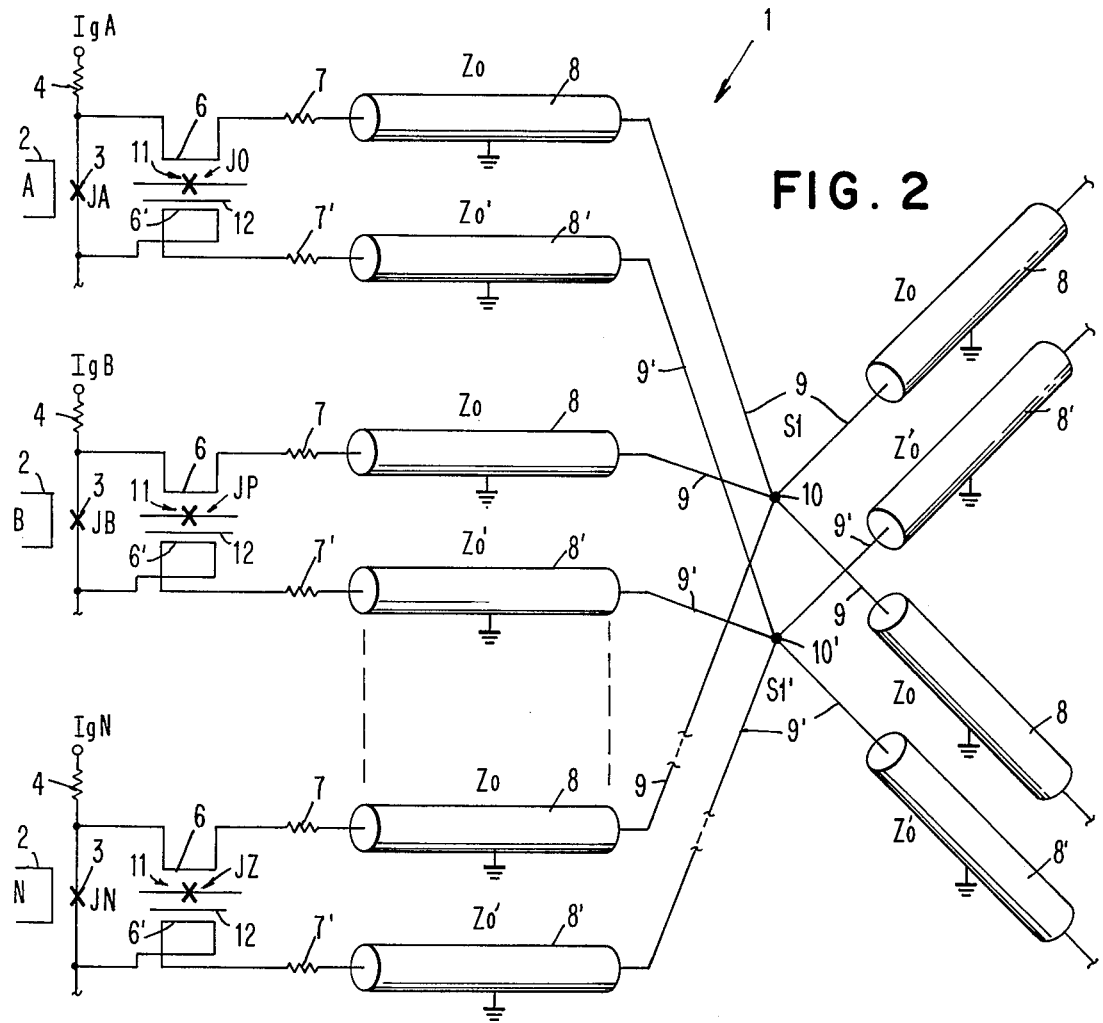
FIG. 2 is a schematic diagram of a two wire over ground plane or a wire above ground plane and wire below ground plane embodiment which utilizes the same principle as the circuit of FIG. 1. Instead of one node as shown in FIG. 1, all transmission lines are connected to a pair of nodes placing each of the actuable devices in parallel with one another. Terminating resistors are disposed in series with each line and a sensing arrangement is shown which permits twice the signal to be obtained as is available in a single wire embodiment.

Referring now to FIG. 2, there is shown a double wire over ground plane or a wire above ground plane and wire below ground plane embodiment which utilizes the same principles as the circuit of FIG. 1. The same reference characters used in FIG. 1 have been applied to similar elements in FIG. 2. Also, to the extent that the wire above ground plane and the wire below ground plane are identical, the wire below ground plane elements have been identified with the same reference characters except that they are primed. The launching of a current pulse from any port differs only in that, simultaneously with the launching of a pulse of a given polarity into transmission line 8, a current pulse of opposite polarity is launched into transmission line 8'. In the double wire over ground plane embodiment, the launching of the opposite polarity current waves is turned to advantage in that, at the sense gate 11 associated with the receiving port, the control line portion 6' is looped as shown in FIG. 2 so that the currents are additive providing, relative to device 11, a field which is twice as large as if only one control line 6 were present. Ground connections in the embodiment of FIG. 2, provide a virtual or floating ground to which all d.c. and a.c. currents flow in the well-known manner of balanced transmission lines. To indicate this, the outer conductors of transmission lines 8 and 8' are shown connected to ground 5. Thus, Josephson devices 3 in FIG. 2, when a pulse is being launched, are switched to the voltage state, presenting a high impedance across the balanced transmission lines in that mode. However, in a receiving mode, devices 3 remain in the zero voltage state, providing a connection to the virtual or floating ground plane for terminating resistors 7,7'.

To the extent that the preferred embodiment includes Josephson junction devices which must be operated in a cryogenic environment, the transmission lines, ground planes and control lines all may be made of superconducting materials such as niobium. Insulation between conductors and ground plane may be an oxide of the metals utilized such as niobium oxide. Alternatively, silicon dioxide or other suitable insulation may be used. Terminating resistors 7,7' should be made of materials which are compatible with the superconductive materials and which remain normally conducting at liquid helium temperatures. Alternatively, the transmission lines, control conductors and bias conductors may be made from metals which are normally conductive at liquid helium temperatures. Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971, and assigned to the same assignee as the present invention. Resistive terminations 7,7', which must not be superconductive at the circuit operation temperature, may be fabricated with compatible materials which display resistance at the desired operating temperature. U.S. Pat. No. 3,913,120, Ser. No. 429,461, filed Dec. 20, 1973 and assigned to the same assignee as the present invention, shows a material and method of fabrication for circuitry and a terminating resistor which may be utilized in the practice of the present invention.

Typical values for transmission line parameters are as follows:

$Z_o$ — 10 ohms linewidths — 0.5 mil oxide thickness (SiO) — 7000 A

While the invention has been particularly shown and described with reference to preferred embodiments thereof, it will be understood by those skilled in the art that the foregoing and other changes in form and details may be made therein without departing from the spirit and scope of the invention.

What is claimed is:

1. A data distribution network comprising:
   a plurality of actuable devices having an actuated and unactuated state,
   means connected to each of said plurality of actuable devices for powering said plurality of actuable devices,
   transmission line means of given characteristic impedance having at least a pair of end portions for interconnecting said plurality of devices and having said an actuable device connected at each of said at least a pair of end portions said devices in their unactuated state forming a portion of said transmission line means, and,
   separately actuable means coupled to each of said plurality of devices for selectively actuating said plurality of devices to provide a pulse of electromagnetic energy from one of said actuable devices in said actuated state to the remainder of said actuable devices in the unactuated state via said transmission line means.

2. A data distribution network according to claim 1 further including sensing means responsive to the presence of said pulse of electromagnetic energy disposed in electromagnetically coupled relationship with said transmission line means.

3. A data distribution network according to claim 1 wherein said actuable devices are devices capable of permitting the flow of Josephson current therethrough.

4. A data distribution network according to claim 1 wherein said means for powering includes a constant current source disposed in series with each of said actuable devices.

5. A data distribution network according to claim 1 wherein said transmission line means for interconnecting said plurality of devices includes a plurality of transmission lines of given characteristic impedance each of said plurality being connected at one end thereof to a respective one of said actuable devices and at the other end thereof to a common node.

6. A data distribution network according to claim 1 wherein said transmission line means for interconnecting said plurality of devices includes a plurality of pairs of transmission lines each of given characteristic impedance each of said plurality of pairs being connected at one end thereof to a respective one of said actuable devices and at the other end thereof to a pair of common nodes.

7. A data distribution network according to claim 1 wherein said means for separately, selectively actuating said plurality of devices includes a control element the flow of current through which switches an associated actuable device.

8. A data distribution network according to claim 2 wherein said sensing means includes an actuable device adapted to switch in response to the presence of said pulse of electromagnetic energy and biasing means electromagnetically coupled to said actuable device for enabling it.

9. A data distribution network according to claim 5 further including a terminating resistor having a value of resistance equal to said given characteristic impedance disposed in series with each of said transmission lines and adjacent each of said actuable devices.

10. A data distribution network according to claim 6 further including a pair of terminating resistors each having a value of resistance equal to said given characteristic impedance disposed in series with each said pair of transmission lines and adjacent each of said actuable devices.

11. A data distribution network according to claim 8 wherein said sensing means includes at least a current carrying element connected to said interconnection means and to each said actuable device.

12. A data distribution network according to claim 9 further including a current carrying element disposed in series with each of said terminating resistors and adjacent each of said actuable devices, and a sensing device disposed in electromagnetically coupled relationship with said element.

13. A data distribution network according to claim 10 further including a pair of current carrying elements disposed in series with each of said pairs of terminating resistors and adjacent each of said actuable devices and a sensing device disposed in electromagnetically coupled relationship with said elements.

14. A data distribution network according to claim 13 wherein one of each of said pairs of current carrying elements has a portion thereof looped to cause current in said portion and in the other of each of said pairs to flow in the same direction.

15. A data distribution network comprising;
    a plurality of actuable devices adapted to permit the flow of Josephson current therethrough, having an actuated and unactuated state,
    a constant current source connected to each of said actuable devices,
    a plurality of transmission lines of given characteristic impedance each of said plurality being connected at one end thereof to a respective one of said actuable devices and at the other end thereof to a common node, and,
    separately actuable means coupled to each of said plurality of actuable devices for selectively actuating each of said plurality of devices to provide a pulse of electromagnetic energy to the remainder of said actuated devices in the unactuated state via said plurality of transmission lines.

16. A data distribution network according to claim 15 further including a Josephson junction device adapted to switch in response to the presence of said pulse disposed in electromagnetically coupled relationship with each of said transmission lines.

17. A data distribution network according to claim 16 further including a terminating resistor having a value of resistance equal to said given characteristic impedance disposed in series with each of said transmission lines and adjacent each of said actuable devices.

18. A data distribution network according to claim 17 wherein said transmission lines are superconductive.

19. A data distribution network comprising:
a plurality of actuable devices adapted to permit the flow of Josephson current therethrough,
a constant current source connected to each of said actuable devices,
a plurality of pairs of transmission lines each of given characteristic impedance each of said plurality of pairs being connected at one end thereof to a respective one of said actuable devices and at the other end thereof to a pair of common nodes, and,
a separate control element electromagnetically coupled to each of said plurality of devices for selectively separately actuating each of said plurality of devices to launch pulses of electromagnetic energy along said plurality of pairs of transmission lines.

20. A data distribution network according to claim 19 further including a Josephson junction device adapted to switch in response to the presence of said pulse disposed in electromagnetically coupled relationship with each of said pairs of transmission lines.

21. A data distribution network according to claim 20 further including a pair of terminating resistors each having a value of resistance equal to said given characteristic impedance disposed in series with each of said plurality of pairs of transmission lines and adjacent each of said actuable devices.

22. A data distribution network according to claim 21 wherein said transmission lines are superconductive.

* * * * *